(12) United States Patent
Bernard et al.

(10) Patent No.: US 7,821,300 B2
(45) Date of Patent: Oct. 26, 2010

(54) SYSTEM AND METHOD FOR CONVERTING BETWEEN CML SIGNAL LOGIC FAMILIES

(75) Inventors: Dan P. Bernard, Austin, TX (US); John C. Schiff, Round Rock, TX (US); Glen A. Wiedemeier, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 12/327,786

(22) Filed: Dec. 3, 2008

(65) Prior Publication Data

US 2010/0134145 A1    Jun. 3, 2010

(51) Int. Cl.
  *H03K 19/086* (2006.01)
  *H03B 1/00* (2006.01)
(52) U.S. Cl. .................. 326/127; 326/112; 326/115; 326/68; 326/63; 327/112; 327/563; 327/108
(58) Field of Classification Search .............. 326/127, 326/112, 115, 63, 68, 81, 83; 327/108, 112, 327/563
See application file for complete search history.

(56) References Cited

U.S. PATENT DOCUMENTS

| | | | |
|---|---|---|---|
| 5,349,253 A | 9/1994 | Ngo et al. | |
| 5,945,843 A | 8/1999 | Hirota et al. | |
| 6,211,699 B1 | 4/2001 | Sudjian | |
| 6,294,932 B1 | 9/2001 | Watarai | |
| 6,809,562 B2 | 10/2004 | Wada et al. | |
| 7,183,805 B2 * | 2/2007 | Wang et al. | 326/86 |
| 7,362,140 B2 * | 4/2008 | Hassoune et al. | 326/115 |
| 7,366,472 B2 * | 4/2008 | Messano et al. | 455/63.1 |
| 7,443,210 B2 * | 10/2008 | Kao et al. | 327/108 |
| 7,532,065 B2 * | 5/2009 | Chen et al. | 330/9 |
| 2003/0085736 A1 | 5/2003 | Tinsley et al. | |
| 2005/0068063 A1 | 3/2005 | Muller et al. | |

(Continued)

FOREIGN PATENT DOCUMENTS

JP        09200037 A       7/1997

OTHER PUBLICATIONS

International Search Report and Written Opinion—International Application No. PCT/ EP2009/ 065533 dated Mar. 3, 2010.

*Primary Examiner*—Vibol Tan
(74) *Attorney, Agent, or Firm*—The Caldwell Firm, LLC

(57) ABSTRACT

A system includes a first CML buffer configured to receive a first bias signal and a first CML signal of a first CML logic family. The first CML buffer produces a second CML signal of the first CML logic family based on the first CML signal and the first bias signal. A first coupling capacitor module couples to the first CML buffer. The first coupling capacitor module receives the second CML signal and produces a third CML signal based on the second CML signal. A second CML buffer couples to the coupling capacitor module and receives a second bias signal and the third CML signal, producing a fourth CML signal of a second CML logic family. A feedback module couples to the second CML buffer and receives the fourth CML signal producing a fifth CML signal. The second CML buffer is produces the fourth CML signal based on the second bias signal, the third CML signal, and the fifth CML signal.

15 Claims, 6 Drawing Sheets

U.S. PATENT DOCUMENTS

| | | |
|---|---|---|
| 2005/0190516 A1 | 9/2005 | Lee et al. |
| 2006/0220696 A1 | 10/2006 | Katou |
| 2008/0001633 A1* | 1/2008 | Narathong et al. ............ 326/87 |
| 2008/0061837 A1* | 3/2008 | Xu et al. ..................... 326/127 |

* cited by examiner

SYSTEM AND METHOD FOR CONVERTING BETWEEN CML SIGNAL LOGIC FAMILIES

TECHNICAL FIELD

The present invention relates generally to the field of computer signaling and, more particularly, to a system and method for converting between CML signal logic families.

BACKGROUND OF THE INVENTION

Modern electronic devices generally employ electrical signals at varying voltages, one of which indicates a logic '1,' while another indicates a logic '0.' The particular voltages representing logic '1' and '0' defines a logic family. The logic family can be implemented in a variety of logic or design styles. One popular logic style is Complementary Metal-Oxide Semiconductor (CMOS).

CMOS is popular in the design of digital integrated circuits in part due to certain technical advantages. For example, CMOS systems generally exhibit very low static-power dissipation, high packing density, and wide noise margins. However, common CMOS systems often suffer from large dynamic power dissipation at high-frequencies. CMOS systems are also highly susceptible to environmental noise and are limited in their maximum operating frequency. The CMOS maximum frequency limitation arises for a variety of reasons, such as device mismatch and voltage rail noise, for example. This problem is exacerbated in some high speed analog circuit designs. For example, in an analog system running at 8 GHz, it is not unreasonable to have tolerances of <5 ps of jitter.

Current Mode Logic (CML) is a differential digital logic family that overcomes some of the shortcomings of standard CMOS systems. Generally, CML systems transmit data at speeds between 312.5 Mbit/s and 3.125 Gbit/s over standard printed circuit boards, using point-to-point, unidirectional transmission. Generally, a CML circuit operates at a lower signal voltage, higher operating frequency, and lower supply voltage than the corresponding CMOS circuit.

Specifically, CML circuits employ differential signaling and rely on fully differential amplifiers. Differential signaling eliminates common mode noise, which also reduces total noise. Additionally, a constant DC current flows through each differential amplifier, steered from one leg of the amplifier to the other, to provide the signaling scheme based on the CML logic family used in the circuit. The supply noise and droop associated with the constant current is significantly lower than that found in common CMOS systems.

Typical CML circuits employ one or both of two characteristic logic families, which differ from static CMOS logic families. For example, in static CMOS, the typical logic family assigns logic '0' to ground and logic '1' to the supply voltage, such as 1.2V, for example.

CML circuits instead employ two distinct logic families called "nCML" and "pCML," both of which use differential signaling. The nCML logic family assigns logic '1' to the supply voltage, for example, 1.2 volts. nCML standards define logic '0' as an offset from logic '1.' For example, in one common system nCML logic '0' is approximately 400 mV less than the supply voltage. Thus, where the supply voltage is 1.2V, the nCML logic '0' is 800 mV. The pCML logic family assigns logic '0' to ground, and defines logic '1' as an offset from ground. For example, in one common system pCML logic '1' is 400 mV.

Each CML family offers particular advantages. For example, the nCML family offers greater gain, and the pCML family offers better noise immunity. In both cases, however, the voltage swing from logic high to logic low is less than the difference between the supply voltage and ground. As such, the relatively smaller differential voltage steers current in the differential amplifiers such that the amplifiers remain in saturation mode.

As nCML and pCML have particular advantages, there are times when a designer desires to mix both logic families together in a particular architecture. However, nCML and pCML circuits have very different design requirements. As such, architectures employing both logic families require differential level translators to convert a CML signal from one logic family to another.

Conventional approaches to converting between CML logic families suffer from significant drawbacks. For example, known CML converters are frequently complex and take up a large circuit area. Additionally, typical CML converters convert from CML to an intermediate format, such as CMOS for example, thereby introducing increased power dissipation and delay. Moreover, the conversion process frequently strips the differential signal into two distinct signals, which must be converted back to a differential signal, which can introduce error.

BRIEF SUMMARY

The following summary is provided to facilitate an understanding of some of the innovative features unique to the embodiments disclosed and is not intended to be a full description. A full appreciation of the various aspects of the embodiments can be gained by taking into consideration the entire specification, claims, drawings, and abstract as a whole.

A system includes a first CML buffer configured to receive a first bias signal and a first CML signal of a first CML logic family. The first CML buffer produces a second CML signal of the first CML logic family based on the first CML signal and the first bias signal. A first coupling capacitor module couples to the first CML buffer. The first coupling capacitor module receives the second CML signal and produces a third CML signal based on the second CML signal. A second CML buffer couples to the coupling capacitor module and receives a second bias signal and the third CML signal, producing a fourth CML signal of a second CML logic family. A feedback module couples to the second CML buffer and receives the fourth CML signal producing a fifth CML signal. The second CML buffer produces the fourth CML signal based on the second bias signal, the third CML signal, and the fifth CML signal.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

Figure 1:
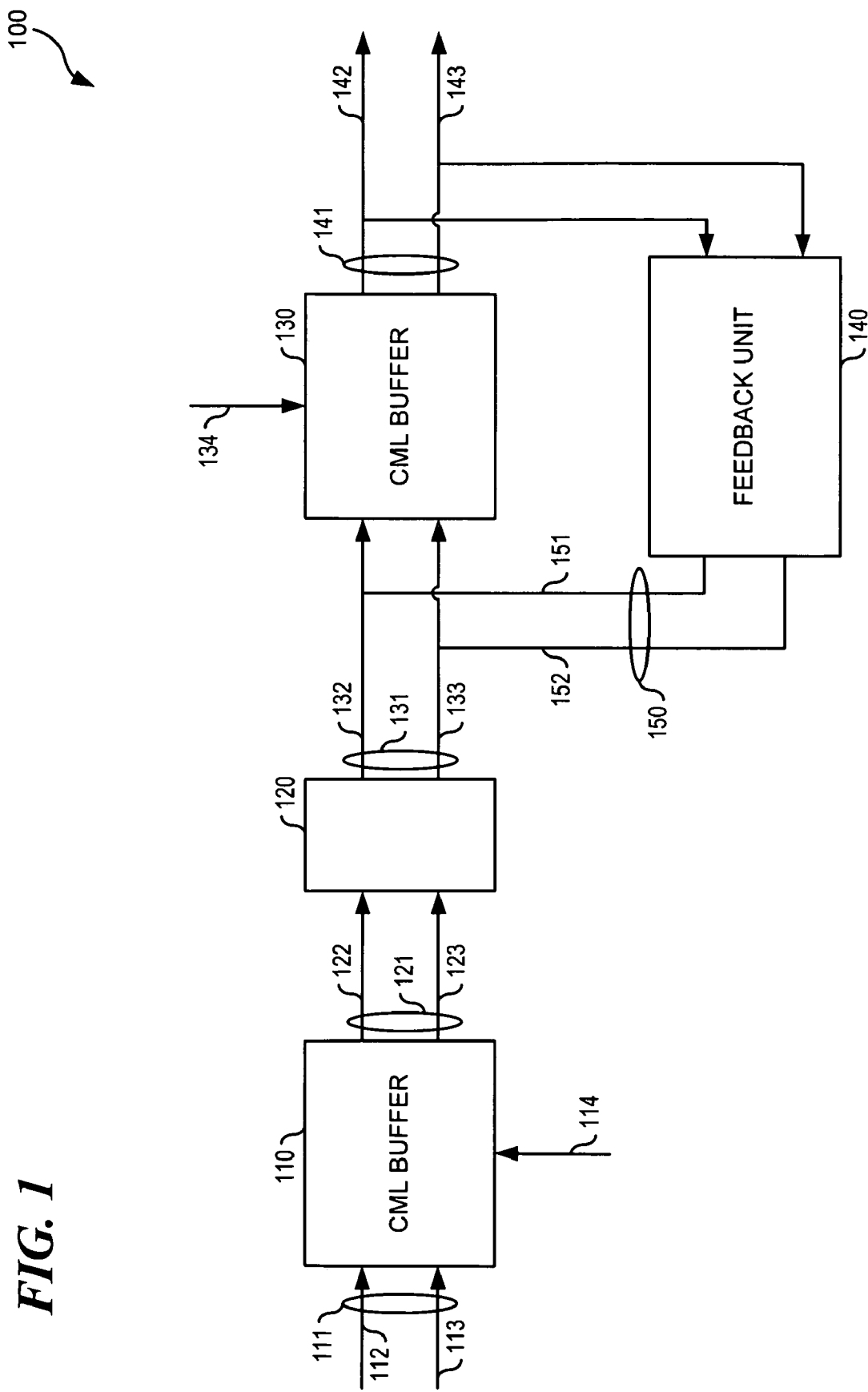
FIG. 1 illustrates a block diagram showing a CML signal logic family converter in accordance with a preferred embodiment.

Referring now to the drawings, FIG. 1 is a high-level block diagram illustrating the basic components of a system 100 for converting a Common Mode Logic (CML) signal of a first logic family to a CML signal of a second logic family, such as between pCML and nCML, for example. In the illustrated embodiment, system 100 comprises a first CML buffer 110, a coupling capacitor module 120, a second CML buffer 130, and a feedback module 140.

Generally, in one embodiment, a system converts a signal in one CML logic family to its opposite counterpart using AC coupling capacitors and positive or negative feedback. For example, in one embodiment, an nCML buffer receives an nCML differential input signal. The nCML buffer couples to coupling capacitors. The coupling capacitors couple voltage pulses to a pCML buffer, with positive pulses and negative pulses reinforced by a feedback resistor. Thus, the signal remains a differential CML signal throughout the conversion In the illustrated embodiment, CML buffer 110 is an otherwise conventional CML buffer of either CML logic family pCML or nCML. CML buffer 110 is configured to receive a CML signal 111. As described above, a CML signal is a differential signal and therefore comprises a high signal and a low signal. In the illustrated embodiment, CML signal 111 includes high CML signal 112 and low CML signal 113.

As described above, a CML signal is encoded as a member of a particular logic family. As such, the voltage associated with high CML signal 112 and low CML signal 113 will depend on the logic family to which CML signal 111 belongs. For example, where CML signal 111 is an nCML signal, high CML signal 112 is at the supply voltage and low CML signal 113 is at a voltage offset from the supply voltage. For ease of illustration, subsequent examples of pCML and nCML encoding will be described with reference to a 1.2V supply voltage and a 400 mV offset.

In the illustrated embodiment, CML buffer 110 also receives a bias signal 114. As described in more detail below, bias signal 114 supplies a stable current source to the circuit. CML buffer 110 produces a second CML signal based on the high CML signal 112, the low CML signal 113 and the bias signal 114. The second CML signal 121 comprises a high CML signal 122, and a low CML signal 123.

In the described embodiment, coupling capacitor module 120 is configured to receive CML signal 121. As described in more detail below, coupling capacitor module 120 produces a differential CML signal 131 based on CML signal 121. Differential CML signal 131 comprises a high CML signal 132 and a low CML signal 133.

In the illustrated embodiment, the second CML buffer 130 is also an otherwise conventional CML buffer. CML buffer 130 is of the second CML logic family. In the disclosed embodiments, the second CML family is the opposite counterpart of the first CML logic family. For example, where CML buffer 110 is a pCML buffer, CML buffer 130 is an nCML buffer. Where CML buffer 110 is an nCML buffer, CML buffer 130 is a pCML buffer.

As described above, CML buffer 130 is configured to receive the differential CML signal 131 produced by coupling capacitor module 120. CML buffer 130 also receives a bias signal 134. Based on CML signal 131 and bias signal 134, CML buffer 130 produces a CML signal 141 that comprises a high CML signal 142 and a low CML signal 143 that are of a second logic family type. For example, where the previously described CML signal 111 is of the pCML logic family, CML signal 141 produced by system 100 is of the nCML logic family.

As described in more detail below, feedback module 140 is configured to receive high CML signal 142 and low CML signal 143 of CML signal 141. Feedback module 140 produces a CML signal 150 comprising a high CML signal 151 and a low CML signal 152. High CML signal 151 couples to high CML signal 132 and low CML signal 152 couples to low CML signal 133. As described in more detail below, feedback module 140 is configured to provide positive or negative feedback, either of which serve to improve the translation from the first logic family to the second logic family and to reduce data loss due to error.

Figure 2:
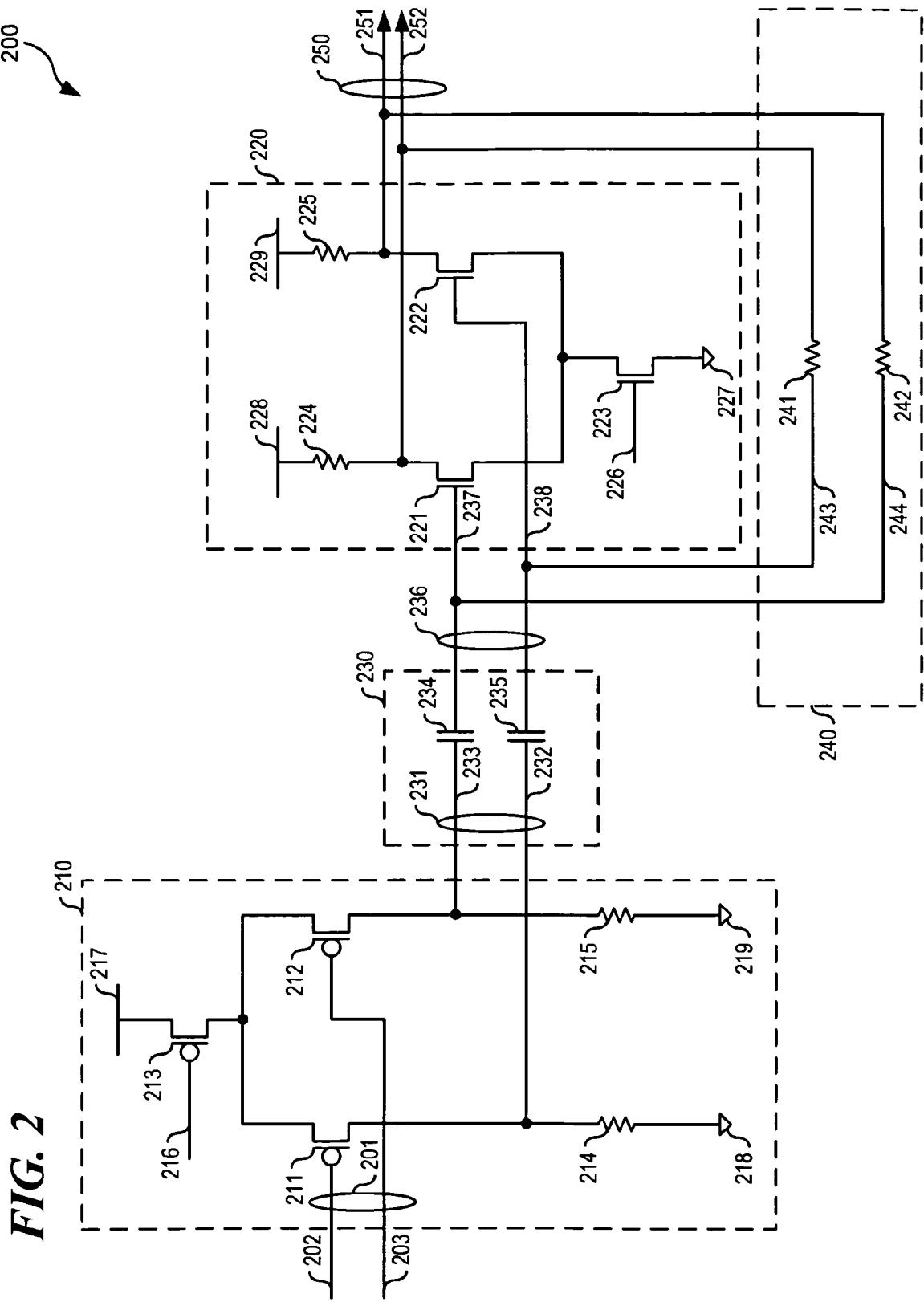
FIG. 2 illustrates a circuit diagram showing a CML signal logic family converter in accordance with a preferred embodiment.

In a particular embodiment, shown in FIG. 2, an exemplary system 200 converts a CML signal of the pCML logic family to a signal of the nCML logic family. As illustrated, system 200 includes a first CML buffer 210, a coupling capacitor module 230, a second CML buffer 220, and a feedback module 240.

In the illustrated embodiment, first CML buffer 210 is an otherwise conventional CML buffer of the pCML type and receives a pCML signal 201. In the illustrated pCML logic family embodiment, logic low is assigned to ground and logic high is 400 mV. As such, high pCML signal 202 is at approximately 400 mV, and low pCML signal 203 is at ground, and together they comprise pCML signal 201. pCML buffer 210 is also configured to receive a bias signal 216.

In the illustrated embodiment, pCML buffer 210 comprises a first p-channel metal-oxide semiconductor (PMOS) 211, a second PMOS 212, a third PMOS 213, a first resistor 214, and a second resistor 215, arranged as illustrated. Specifically, first PMOS 211, second PMOS 212, and third PMOS 213 each comprise a gate, an input and an output. First resistor 214 and second resistor 215 each comprise an input and an output.

As shown, the PMOS 211 input couples to the PMOS 213 output. The PMOS 211 output couples to the resistor 214 input, which couples to ground 218. The PMOS 211 gate receives the high pCML signal 202. As described in more detail below, the PMOS 211 output is a low pCML signal 232 of pCML signal 231.

As illustrated, the PMOS 212 input couples to the PMOS 213 output. The PMOS 212 output couples to resistor 215, which couples to ground 219. The PMOS 212 gate receives the low pCML input signal 203. As described in more detail below, the PMOS 212 output is a high pCML signal 233 of pCML signal 231.

As described above, the gate of PMOS 213 receives the bias signal 216. The input of the third PMOS 213 couples to a voltage source 217. Generally, bias signal 216 and voltage source 217 are configured such that PMOS 213 functions as a relatively stable current source for CML buffer 210.

In operation, when high pCML input signal 202 is 400 mV, PMOS 211 is mostly turned off, reducing the current across resistor 214. With a low current across resistor 214, pCML signal 232 becomes low. At the same time, when the pCML input signal 203 is tied to ground PMOS 212 is turned partially on placing a high current across resistor 215. With a high current across the second resistor 215 the pCML output signal 233 becomes high.

As described above, system 200 includes coupling capacitor module 230, which couples to CML buffer 210. In the illustrated embodiment, coupling capacitor module 230 is configured to receive CML signal 231 and produce CML signal 236. Coupling capacitor module 230 comprises a first capacitor 234, and a second capacitor 235. As described in more detail below, capacitor 234 couples to the high CML signals 233 and 237 and capacitor 235 couples to the low CML signals 232 and 238.

As described above, system 200 includes CML buffer 220, which couples to coupling capacitor module 230. In the illustrated embodiment, second CML buffer 220 is an otherwise conventional CML buffer of the nCML type and receives CML signal 236. As described above, in the illustrated pCML logic family embodiment, logic low is assigned to ground and logic high is 400 mV. As such, high pCML signal 237 is at approximately 400 mV, low pCML signal 238 is at ground, and together they comprise CML signal 236. nCML buffer 220 is also configured to receive a bias signal 226.

In the illustrated embodiment, nCML buffer 220 comprises a first n-channel metal-oxide semiconductor (NMOS) 221, a second NMOS 222, a third NMOS 223, a first resistor 224, and a second resistor 225, arranged as illustrated. Specifically, NMOS 221, NMOS 222, and NMOS 223 each comprise a gate, an input, and an output.

In the illustrated embodiment, the NMOS 221 input couples to resistor 224, which couples to the voltage source 228. One skilled in the art will note that in the illustrated embodiments, a number of voltage sources (such as voltage sources 217, 228, and 229, for example) are shown as separate voltage sources. In an alternate embodiment, one or more of the voltage sources can be the same, provided the intended voltage is the same. The NMOS 221 output couples to the NMOS 223 input. The NMOS 221 gate receives high CML signal 237. As described in more detail below, the NMOS 221 output is a low nCML signal 252.

In the illustrated embodiment, the NMOS 222 input couples to resistor 225, which further couples to the voltage source 229. The NMOS 222 output couples to the NMOS 223 input. The NMOS 222 gate receives the low CML signal 238. As described in more detail below, the NMOS 222 output is a high nCML signal 251.

The NMOS 223 gate receives bias signal 226. The NMOS 223 output couples to ground 227. Generally, bias signal 226 is configured such that NMOS 223 functions as a relatively stable current source for CML buffer 220.

In the illustrated embodiment of nCML logic, logic high is the voltage source, and logic low is an offset from the voltage source. In operation, when high CML signal 237 is at a voltage of 1.2V, NMOS 221 is turned fully on, placing a high current across resistor 224. With a high current across resistor 224, the CML signal 252 becomes logic low. At the same time, CML signal 238 is at a voltage of 800 mV, and so NMOS 222 is turned partially off, reducing the current across resistor 225. With a relatively low current across resistor 225, CML signal 251 becomes logic high.

As described above, system 200 includes feedback module 240, which couples to CML buffer 220. In the illustrated embodiment, feedback module 240 comprises a first resistor 241 and a second resistor 242, arranged as shown. Resistor 241 couples to CML signal 252, and further couples to CML signal 238. Resistor 242 couples to CML signal 251, and further couples to CML signal 237. So configured, feed module 240 provides positive feedback as described in more detail below.

In an exemplary operation of the illustrated embodiment, starting state conditions are: pCML signal 202 is logic low, and pCML signal 203 is logic high. nCML signal 251 is logic low and nCML signal 252 is logic high. From this starting condition, the pCML signals 202 and 203 are inverted, pulling CML signal 203 to logic low and CML signal 202 to logic high. CML signal 231 matches the pCML signal 201 received by CML buffer 210. The rising voltage on high CML signal 233 causes a positive pulse to capacitively couple to CML signal 237 through capacitor 234. Similarly, the dropping voltage on CML signal 232 causes a negative pulse to capacitively couple to CML signal 238 through capacitor 235.

The positive pulse briefly turns NMOS 221 on, dropping the voltage of CML signal 252. The negative pulse briefly turns off NMOS 222, raising the voltage of CML signal 251. The rising voltage of CML signal 251 reinforces the positively coupled pulse on CML signal 237 through resistor 242, pulling CML signal 251 fully high. The dropping voltage of CML signal 252 reinforces the negative pulse on CML signal 238 through resistor 241 pulling CML signal 252 fully low.

As such, system 200 converts the input CML signal 201 from a pCML input to an nCML output, CML signal 250. Accordingly, system 200 provides an nCML signal of equivalent logic state from a pCML input. In the illustrated embodiment, system 200 employs positive feedback through feedback module 240. In an alternate embodiment, described below, a similar system employs negative feedback.

Figure 3:
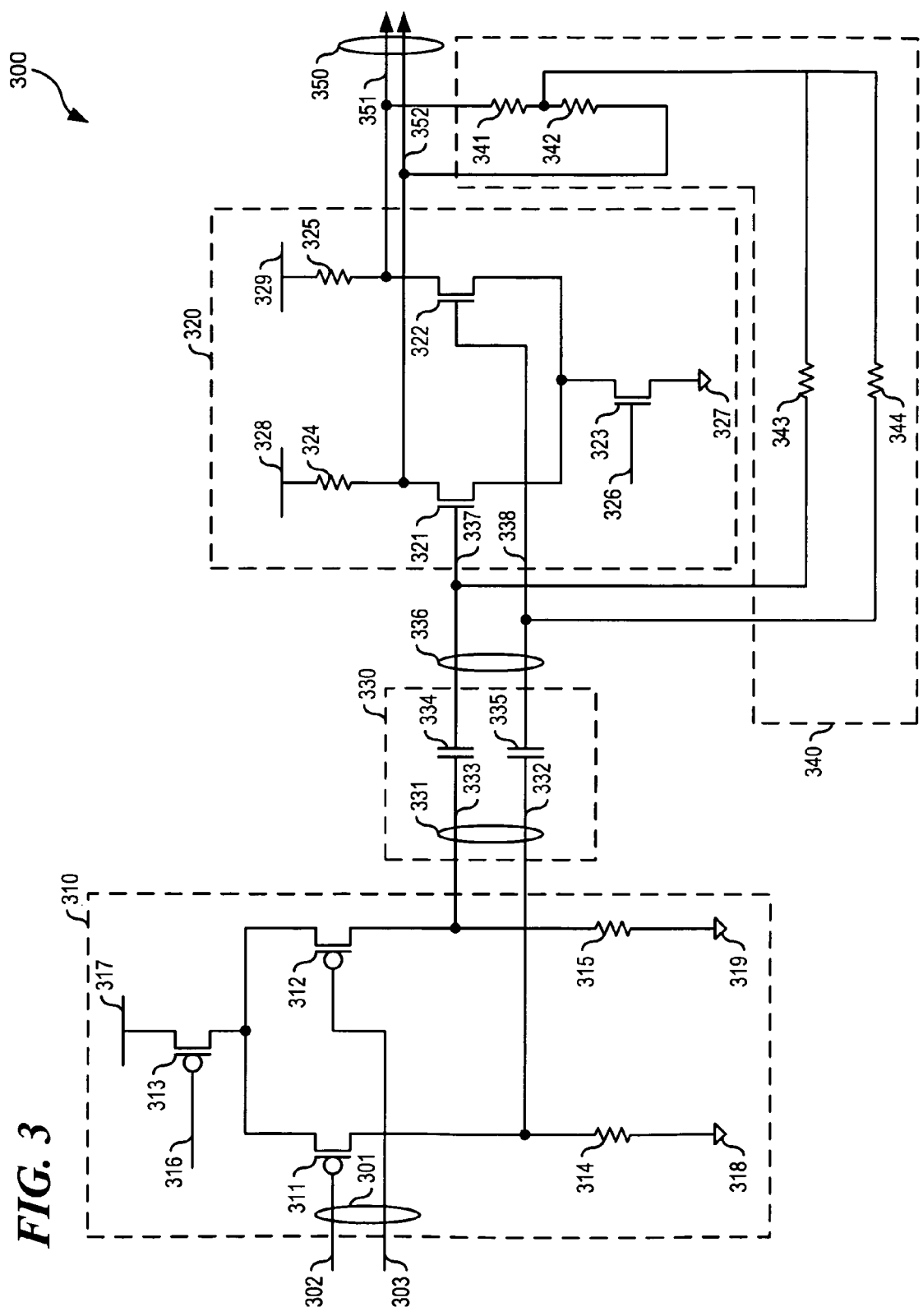
FIG. 3 illustrates a circuit diagram showing a CML signal logic family converter in accordance with a preferred embodiment.

For example, in one embodiment, shown in FIG. 3, a system 300 converts a CML signal of the pCML logic family to a signal of the nCML logic family using negative feedback. As illustrated, system 300 includes a first CML buffer 310, a coupling capacitor module 330, a second CML buffer 320, and a feedback module 340. Generally, components of system 300 are configured as similar components of system 200 of FIG. 2, described above.

For example, CML buffer 310 receives a high pCML signal 302 at approximately 400 mV, a low pCML signal 303 at ground, and a bias signal 316. Specifically, pCML buffer 310 comprises a first PMOS 311, a second pMOS 312, a third pMOS 313, a first resistor 314, and a second resistor 315, arranged as shown.

Similarly, coupling capacitor module 330 includes a first capacitor 334 and a second capacitor 335, arranged as shown. Similarly, second CML buffer 320 includes a first NMOS 321, a second NMOS 322, a third NMOS 323, a first resistor 324, and a second resistor 325, arranged as shown. Feedback module 340, however, is configured for negative feedback.

Specifically, feedback module 340 comprises a first resistor 341, a second resistor 342, a third resistor 343, and a fourth resistor 344. Resistor 341 couples to the high CML signal 351, and further couples to resistor 342, resistor 343, and resistor 344. Resistor 342 couples to the low CML signal 352, and further couples to resistor 341, resistor 343 and resistor 344. Resistor 343 couples to the high CML signal 337. Resistor 344 couples to the low CML signal 338.

In an exemplary operation of the illustrated embodiment, starting state conditions are: pCML signal 302 is logic low, and pCML signal 303 is logic high. nCML signal 351 is logic low and nCML signal 352 is logic high. From this starting condition, the pCML signals 302 and 303 are inverted, pulling CML signal 303 to logic low and CML signal 302 to logic high. CML signal 331 matches the pCML signal 301 received by CML buffer 310. The rising voltage on high CML signal 333 causes a positive pulse to capacitively couple to CML signal 337 through capacitor 334. Similarly, the dropping voltage on CML signal 332 causes a negative pulse to capacitively couple to CML signal 338 through capacitor 335.

Using negative feedback, resistors 341 and 342 provide a 1.0V common-mode voltage. This 1.0V common-mode voltage propagates to the input of CML buffer 320 though resistors 343 and 344. This 1.0V common-mode voltage partially counteracts, with negative feedback, the voltage pulses coupled through capacitors 334 and 335.

As such, system 300 converts the input CML signal 301 from a pCML input to an nCML output, CML signal 350. Accordingly, system 300 provides an nCML signal of equivalent logic state from a pCML input. In the illustrated embodiment, system 300 employs negative feedback through feedback module 340. As illustrated, system 300 converts a pCML signal to an nCML signal using negative feedback. In an alternate embodiment, a suitably configured similar system can convert an nCML signal to a pCML signal using positive feedback.

Figure 4:
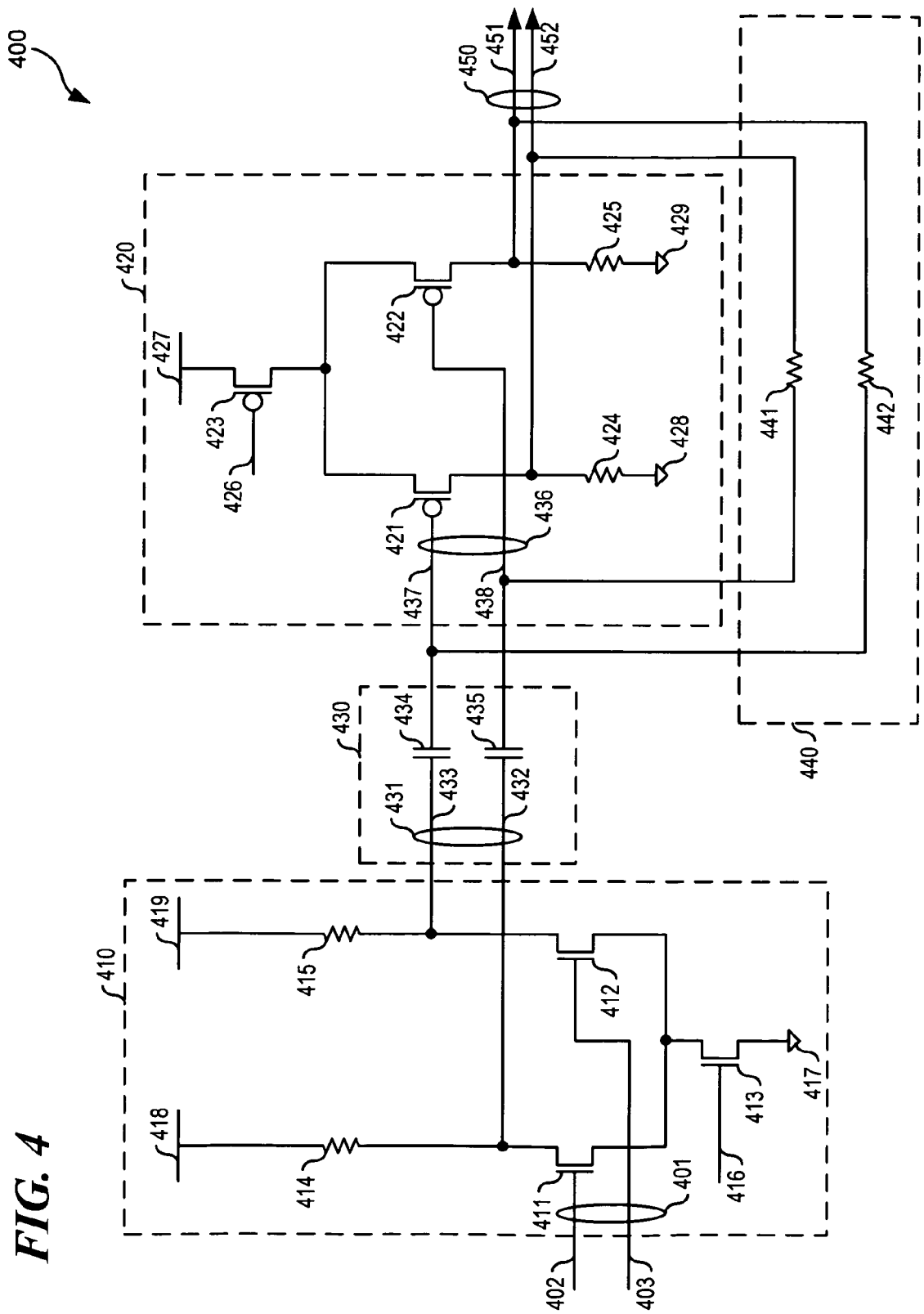
FIG. 4 illustrates a circuit diagram showing a CML signal logic family converter in accordance with a preferred embodiment.

For example, in one embodiment, shown in FIG. 4, a system 400 converts a CML signal of the nCML logic family to a signal of the pCML logic family, using positive feedback. As illustrated, system 400 uses an otherwise conventional nCML buffer 410, a coupling capacitor module 430, an otherwise conventional pCML buffer 420, and a feedback module 440

In the illustrated embodiment, the first CML buffer 410 of nCML type receives an nCML signal 401. As described above, nCML signal 401 comprises a high CML signal 402 at 1.2V and a low CML 403 signal at 800 mV.

Similar to the nCML buffer of system 200, nCML buffer 410 of the illustrated embodiment comprises a first NMOS 411, a second NMOS 412, a third NMOS 413, a first resistor 414, and a second resistor 415, arranged as shown. The NMOS 411 gate receives the high nCML signal 402. The NMOS 411 output is a low nCML signal 432. The NMOS 412 gate receives the low nCML input signal 403. The NMOS 412 output is a high nCML signal 433. High nCML 433 and low nCML signal 432 comprise CML signal 431.

In the illustrated embodiment, the NMOS 413 gate receives a bias signal 416. When the high nCML input signal 402 is at 1.2V, NMOS 411 is turned on, placing a high current across resistor 414. With a high current across resistor 414, nCML signal 432 becomes low. When nCML input signal 403 is at 800 mV, NMOS 412 is turned partially off, placing a low current across resistor 415. With a low current across resistor 415, nCML output signal 433 becomes high.

Similar to system 200 of FIG. 2, coupling capacitor module 430 includes a first capacitor 434 and a second capacitor 435, arranged as shown. Coupling capacitor module 430 receives nCML signal 431 and produces nCML signal 436.

As described above, the second CML buffer 420 is an otherwise conventional pCML buffer. Similar to the pCML buffer of system 200, CML buffer 420 comprises a first PMOS 421, a second PMOS 422, a third PMOS 423, a first resistor 424, and a second resistor 425, arranged as shown.

In the illustrated embodiment, CML buffer 420 receives CML signal 436 from coupling capacitor module 430, and a bias signal 426. CML signal 436 comprises a high CML signal 437 and a low CML signal 438. The PMOS 421 gate receives high CML signal 437. The PMOS 422 gate receives low CML signal 438. The PMOS 423 gate receives bias signal 426. Similar to system 200, the output of PMOS 421 is a low CML signal 452. The output of PMOS 422 is a high CML signal 451. High CML signal 451 and low CML signal 452 comprise CML signal 450, the output signal of CML buffer 420.

Similar to the positive feedback module of system 200, feedback module 440 comprises a first resistor 441 and a second resistor 442. Resistor 441 couples to low CML signal 452, and further couples to low CML signal 438. Resistor 442 couples to high CML signal 451, and further couples to high CML signal 437.

In an exemplary operation of the illustrated embodiment, starting state conditions are: nCML signal 402 is logic low, and nCML signal 403 is logic high. pCML signal 451 is logic low and pCML signal 452 is logic high. From this starting condition, the nCML signals 402 and 403 are inverted, pulling CML signal 403 to logic low and CML signal 402 to logic high. CML signal 431 matches the nCML signal 401 received by CML buffer 410. The rising voltage on high CML signal 433 causes a positive pulse to capacitively couple to CML signal 437 through capacitor 434. Similarly, the dropping voltage on CML signal 432 causes a negative pulse to capacitively couple to CML signal 438 through capacitor 435.

The positive pulse briefly turns PMOS 421 partially off, dropping the voltage of CML signal 452. The negative pulse briefly turns on PMOS 422, raising the voltage of CML signal 451. The rising voltage of CML signal 451 reinforces the positively coupled pulse on CML signal 437 through resistor 442, pulling CML signal 451 fully high. The dropping voltage of CML signal 452 reinforces the negative pulse on CML signal 438 through resistor 441 pulling CML signal 452 fully low.

As such, system 400 converts the input CML signal 401 from an nCML input to a pCML output, CML signal 450. Accordingly, system 400 provides a pCML signal of equivalent logic state from an nCML input. In the illustrated embodiment, system 400 employs positive feedback through feedback module 440. In an alternate embodiment, described below, a similar system employs negative feedback.

Figure 5:
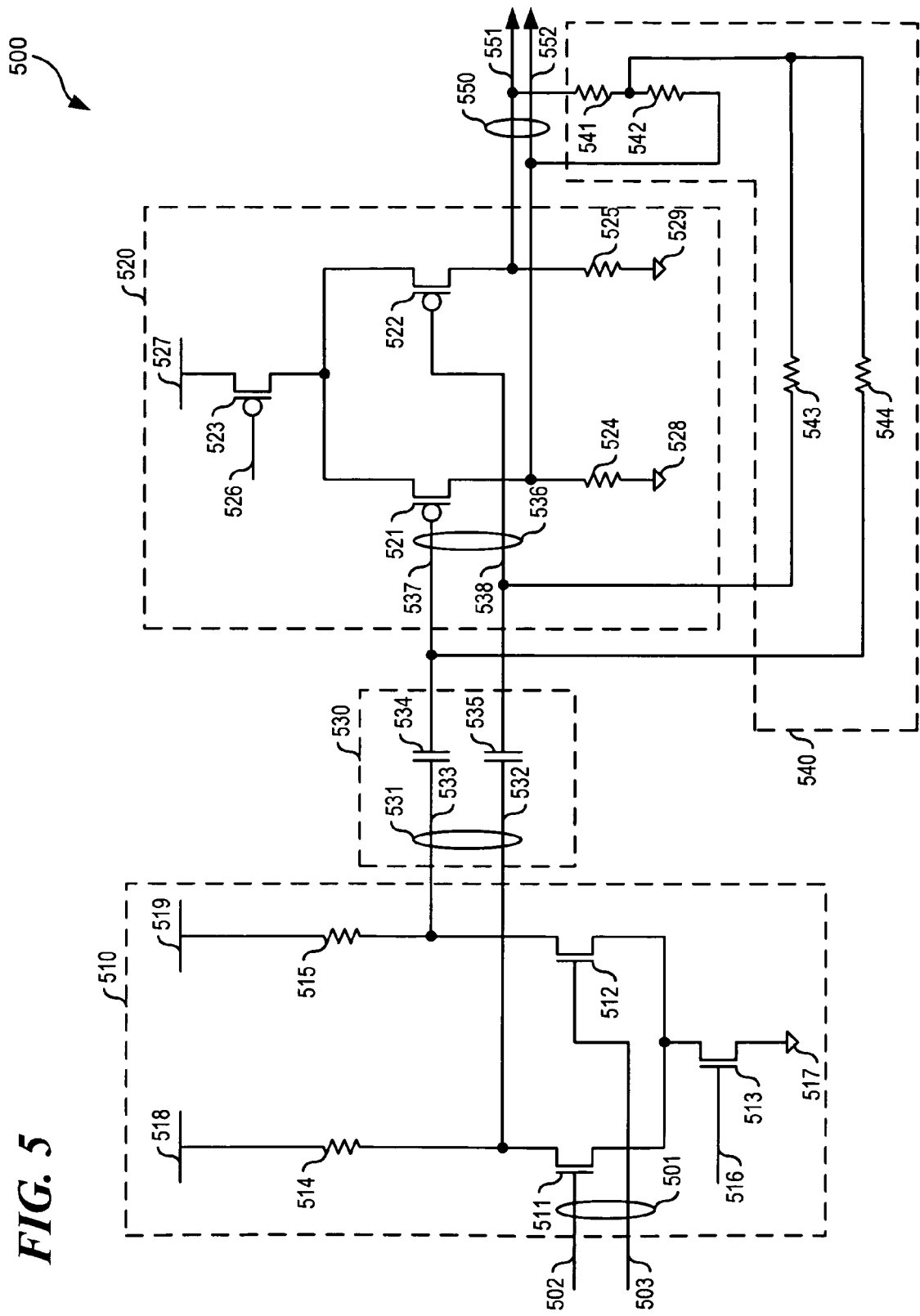
FIG. 5 illustrates a circuit diagram showing a CML signal logic family converter in accordance with a preferred embodiment.

For example, in one embodiment, shown in FIG. 5, a system 500 converts a CML signal of the nCML logic family to a signal of the pCML logic family using negative feedback. As illustrated, system 500 includes a first CML buffer 510, a coupling capacitor module 530, a second CML buffer 520, and a feedback module 540. Generally, components of system 500 are configured similarly as corresponding components of system 400 of FIG. 4, described above.

For example, CML buffer 510 receives a high nCML signal 502 at approximately 1.2V, a low nCML signal 503 at approximately 800 mV, and a bias signal 516. Specifically, nCML buffer 510 comprises a first NMOS 511, a second NMOS 512, a third NMOS 513, a first resistor 514, and a second resistor 515, arranged as shown.

Similarly, coupling capacitor module 530 includes a first capacitor 534 and a second capacitor 535, arranged as shown. Similarly, second CML buffer 520 includes a first PMOS 521, a second PMOS 522, a third PMOS 523, a first resistor 524, and a second resistor 525, arranged as shown. Feedback module 540, however, is configured for negative feedback similarly to feedback module 340 of system 300. Specifically, feedback module 540 comprises a first resistor 541, a second resistor 542, a third resistor 543, and a fourth resistor 544, arranged as shown.

In an exemplary operation of the illustrated embodiment, starting state conditions are: nCML signal 502 is logic low, and nCML signal 503 is logic high. pCML signal 551 is logic low and pCML signal 552 is logic high. From this starting condition, the nCML signals 502 and 503 are inverted, pulling CML signal 503 to logic low and CML signal 502 to logic high. CML signal 531 matches the nCML signal 501 received by CML buffer 510. The rising voltage on high CML signal 533 causes a positive pulse to capacitively couple to CML signal 537 through capacitor 534. Similarly, the dropping voltage on CML signal 532 causes a negative pulse to capacitively couple to CML signal 538 through capacitor 535.

Using negative feedback, resistors 541 and 542 provide a 1.0V common-mode voltage. This 1.0V common-mode voltage propagates to the input of CML buffer 520 though resistors 543 and 544. This 1.0V common-mode voltage partially counteracts, with negative feedback, the voltage pulses coupled through capacitors 534 and 535.

As such, system 500 converts the input CML signal 501 from an nCML input to a pCML output, CML signal 550. Accordingly, system 500 provides a pCML signal of equivalent logic state from an nCML input. In the illustrated embodiment, system 500 employs negative feedback through feedback module 540.

Figure 6:
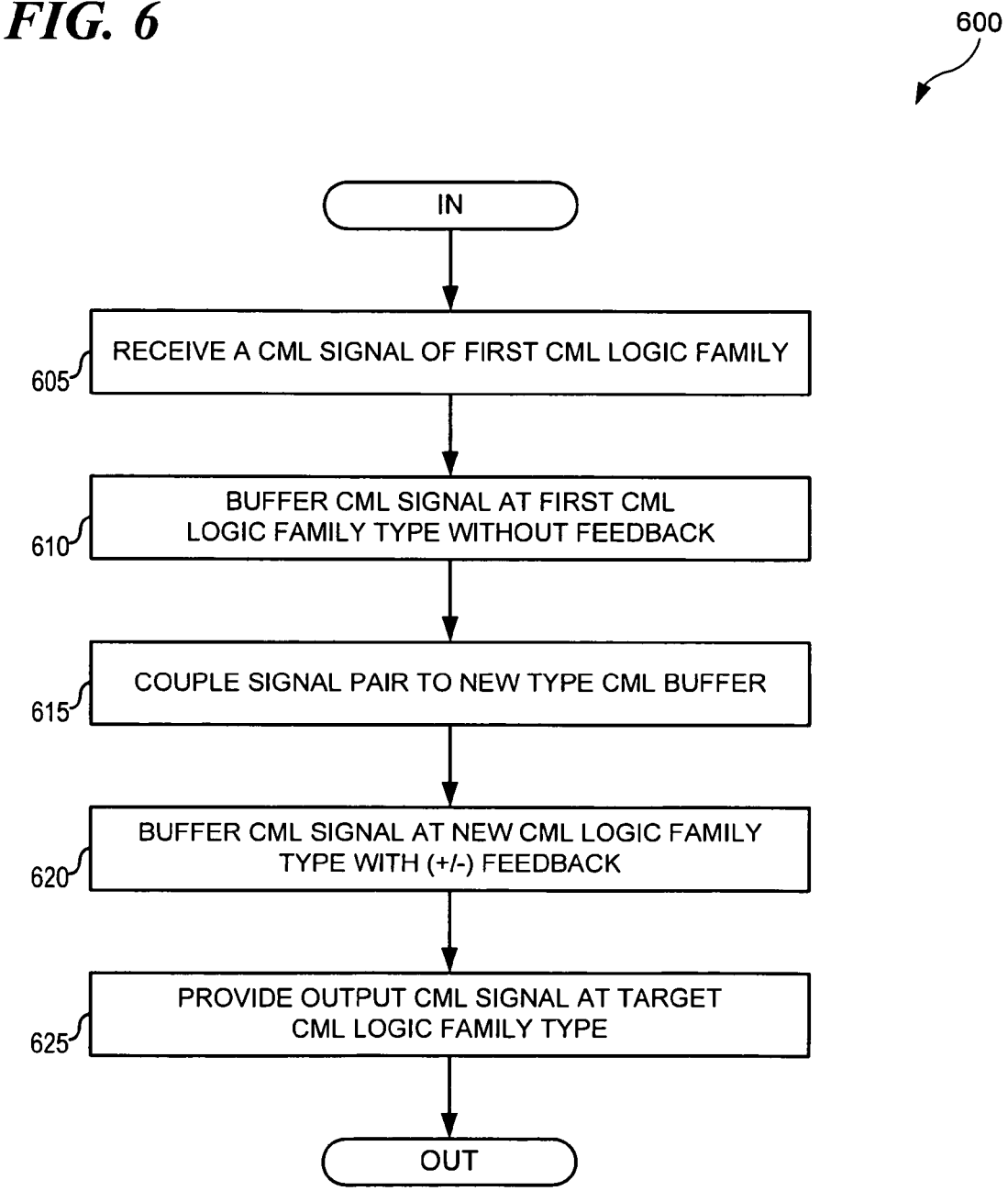
FIG. 6 illustrates a high-level flow diagram depicting logical operational steps of a CML signal logic family converter method, which can be implemented in accordance with a preferred embodiment.

Therefore, as described above the embodiments disclosed herein generally convert CML signals of a first logic family into logically equivalent CML signals of a second family. Additionally, certain embodiments employ positive or negative feedback to enhance system performance. FIG. 6 describes a general sequence of operations, in accordance with one embodiment.

Specifically, FIG. 6 illustrates a high-level flow chart 600 that depicts logical operational steps performed by, for example, system 100 of FIG. 1, which may be implemented in accordance with a preferred embodiment.

As indicated at block 605, the process begins, wherein system 100 receives a CML signal of a first CML logic family comprising a signal pair. For example, CML buffer 110 receives CML signal 111. Next, as indicated at block 610, system 100 buffers the received CML signal without feedback. For example, CML buffer 110 buffers CML signal 111 without feedback.

Next, as indicated in block 615, system 100 couples the buffered CML signal to a CML buffer of a second CML logic family type. For example, coupling capacitor module 120 couples CML signal 121 to CML buffer 130. Next, as indicated at block 620, system 100 buffers the CML signal at the second CML logic family, with feedback. For example, CML buffer 130 buffers CML signal 131 at the output CML logic family, in conjunction with feedback module 140. Additionally, as described above, in one embodiment CML buffer 130 buffers CML signal 131 using positive feedback. In an alternate embodiment, CML buffer 130 buffers CML signal 131 using negative feedback.

Next, as indicated at block 625, system 100 provides an output CML signal of the new CML logic family, and the process ends. For example, CML buffer 130 produces CML signal 141 of a second logic family.

Therefore, the disclosed embodiments provide a system and method to convert between different CML logic families. A buffer receives a CML signal in a first CML logic family, and buffers that signal, which is then coupled to a CML buffer of a second logic family type. The second CML buffer also buffers the CML signal, but in the target CML logic family, with feedback.

Accordingly, the disclosed embodiments provide numerous advantages over other methods and systems. For example, the embodiments disclosed herein are significantly less complex, and therefore occupy smaller circuit area, than previous solutions. Additionally, the embodiments disclosed herein do not require conversion to an intermediate format, which reduces power dissipation and delay as compared to conventional approaches. Moreover, the disclosed embodiments allow the differential signal to remain in a differential format, eliminating the need for conversion into a non-differential format and back again.

One skilled in the art will appreciate that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

The invention claimed is:

1. A system, comprising:
    a first CML buffer configured to receive a first bias signal and a first CML signal of a first CML logic family, and to produce a second CML signal of the first CML logic family based on the first CML signal and the first bias signal;
    a first coupling capacitor module coupled to the first CML buffer and configured to receive the second CML signal and to produce a third CML signal based on the second CML signal;
    a second CML buffer configured to receive a second bias signal and the third CML signal, and to produce a fourth CML signal of a second CML logic family;
    a feedback module coupled to the second CML buffer and configured to receive the fourth CML signal and produce a fifth CML signal;
    wherein the second CML buffer is configured to produce the fourth CML signal based on the second bias signal, the third CML signal, and the fifth CML signal; and
    wherein the feedback module further comprises:
    a first resistor comprising an input and an output, wherein the input of the first resistor couples to a high output of the fourth CML signal;
    a second resistor comprising and input and an output, wherein the output of the second resistor couples to the output of the first resistor, and the input of the second resistor couples to a low signal of the fourth CML signal;
    a third resistor comprising an input and an output, wherein the input of the third resistor couples to the output of the first resistor and the output of the second resistor, and the output of the third resistor couples to a high signal of the third CML signal; and
    a fourth resistor comprising an input and an output, wherein the input of the fourth resistor couples to the output of the first resistor and the output of the second resistor, and the output of the fourth resistor couples to a low signal of the third CML signal.

2. The system of claim 1, wherein the coupling capacitor module comprises:
    a first capacitor configured to receive a high input signal of the second CML signal and to generate a high output of the third CML signal; and a second capacitor configured to receive a low input signal of the second CML signal and to generate a low output of the third CML signal.

3. The system of claim 1, wherein the feedback module further comprises:
a first resistor comprising an input and an output, wherein the input of the first resistor couples to a low output of the fourth CML signal, and the output of the first resistor couples to a low signal of the third CML signal; and
a second resistor comprising an input and an output, wherein the input of the second resistor couples to a high output of the fourth CML signal, and the output of the second resistor couples to a high signal of the third CML signal.

4. The system of claim 1, wherein the signal of the first logic family is a pCML signal, and the signal of the second logic family is an nCML signal.

5. The system of claim 1, wherein the signal of the first logic family is an nCML signal, and the signal of the second logic family is a pCML signal.

6. A system, comprising:
a first CML buffer configured to receive a first bias signal and a first CML signal of a first CML logic family, and to produce a second CML signal of the first CML logic family based on the first CML signal and the first bias signal;
a first coupling capacitor module coupled to the first CML buffer and configured to receive the second CML signal and to produce a third CML signal based on the second CML signal;
a second CML buffer configured to receive a second bias signal and the third CML signal, and to produce a fourth CML signal of a second CML logic family;
a feedback module coupled to the second CML buffer and configured to receive the fourth CML signal and produce a fifth CML signal;
wherein the second CML buffer is configured to produce the fourth CML signal based on the second bias signal, the third CML signal, and the fifth CML signal;
wherein the first CML buffer is a pCML buffer; and
wherein the pCML buffer comprises:
a first PMOS comprising a gate, an input, and an output, and configured to receive a high pCML input signal at the gate of the first PMOS;
a second PMOS comprising a gate, an input, and an output, and configured to receive a low pCML signal at the gate of the second PMOS;
a third PMOS comprising a gate, an input, and an output, and configured to receive a bias input signal at the gate of the third PMOS;
the third PMOS further configured to receive an input voltage and to generate an output signal coupled to the input of the first PMOS and the input of the second PMOS;
a first resistor coupled to the output of the first PMOS and further coupled to ground;
wherein the output of the first PMOS is a low signal of the second CML signal;
a second resistor coupled to the output of the second PMOS and further coupled to ground; and
wherein the output of the second PMOS is a high signal of the second CML signal.

7. The system of Claim 6, wherein the second CML buffer is an nCML buffer.

8. The system of claim 7, wherein the nCML buffer comprises:

a first NMOS comprising a gate, an input, and an output, and configured to receive a high input of the third CML signal at the gate of the first NMOS;
a second NMOS comprising a gate, an input, and an output, and configured to receive a low input of the third CML signal at the gate of the second NMOS;
a third NMOS comprising a gate, an input, and an output, and configured to receive a bias input signal at the gate of the third NMOS;
the input of the third NMOS coupled to the output of the first NMOS and the output of the second NMOS, and the output of the third NMOS coupled to ground;
a third resistor coupled to the input of the first NMOS and further coupled to a voltage source, wherein the output of the first NMOS is a low signal of the fourth CML signal; and
a fourth resistor coupled to the input of the second NMOS and further coupled to a voltage source, wherein the output of the second NMOS is the high signal of the fourth CML signal.

9. A system, comprising:
a first CML buffer configured to receive a first bias signal and a first CML signal of a first CML logic family, and to produce a second CML signal of the first CML logic family based on the first CML signal and the first bias signal;
a first coupling capacitor module coupled to the first CML buffer and configured to receive the second CML signal and to produce a third CML signal based on the second CML signal;
a second CML buffer configured to receive a second bias signal and the third CML signal, and to produce a fourth CML signal of a second CML logic family;
a feedback module coupled to the second CML buffer and configured to receive the fourth CML signal and produce a fifth CML signal;
wherein the second CML buffer is configured to produce the fourth CML signal based on the second bias signal, the third CML signal, and the fifth CML signal;
wherein the first CML buffer is an nCML buffer; and
wherein the nCML buffer further comprises:
a first NMOS comprising a gate, an input, and an output, and configured to receive a high input of an nCML signal at the gate of the first NMOS;
a second NMOS comprising a gate, an input, and an output, and configured to receive a low input of an nCML signal at the gate of the second NMOS;
a third NMOS comprising a gate, an input, and an output, and configured to receive a bias input signal at the gate of the third NMOS;
the input of the third NMOS coupled to the output of the first NMOS and the output of the second NMOS, and the output of the third NMOS coupled to ground;
a first resistor coupled to the input of the first NMOS and further coupled to a voltage source, wherein the output of the first NMOS is a low signal of the second CML signal; and
a second resistor coupled to the input of the second NMOS and further coupled to a voltage source, wherein the output of the second NMOS is the high signal of the fourth CML signal.

10. The system of Claim 9, wherein the second CML buffer is a pCML buffer.

11. The system of claim 10, wherein the pCML buffer comprises:

a first PMOS comprising a gate, an input, and an output, and configured to receive a high signal of the third CML signal at the gate of the first PMOS;
a second PMOS comprising a gate, an input, and an output, and configured to receive a low signal of the third CML signal at the gate of the second PMOS;
a third PMOS comprising a gate, an input, and an output, and configured to receive a bias input signal at the gate of the third PMOS;
the third PMOS further configured to receive an input voltage and to generate an output signal coupled to the input of the first PMOS and the input of the second PMOS;
a third resistor coupled to the output of the first PMOS and further coupled to ground;
wherein the output of the first PMOS is a low signal of the fourth CML signal;
a fourth resistor coupled to the output of the second PMOS and further coupled to ground; and
wherein the output of the second PMOS is a high signal of the second CML signal.

12. A system comprising:
a first PMOS comprising a gate, an input, and an output, and configured to receive a high pCML input signal at the gate of the first PMOS;
a second PMOS comprising a gate, an input, and an output, and configured to receive a low pCML signal at the gate of the second PMOS;
a third PMOS comprising a gate, an input, and an output, and configured to receive a bias input signal at the gate of the third PMOS;
the third PMOS further configured to receive an input voltage and to generate an output signal coupled to the input of the first PMOS and the input of the second PMOS;
a first resistor coupled to the output of the first PMOS and further coupled to ground;
wherein the output of the first PMOS is a low signal of the second CML signal;
a second resistor coupled to the output of the second PMOS and further coupled to ground;
wherein the output of the second PMOS is a high signal of the second CML signal;
a first capacitor configured to receive a high input signal of the second CML signal and to generate a high output of the third CML signal;
a second capacitor configured to receive a low input signal of the second CML signal and to generate a low output of the third CML signal;
a first NMOS comprising a gate, an input, and an output, and configured to receive a high input of the third CML signal at the gate of the first NMOS;
a second NMOS comprising a gate, an input, and an output, and configured to receive a low input of the third CML signal at the gate of the second NMOS;
a third NMOS comprising a gate, an input, and an output, and configured to receive a bias input signal at the gate of the third NMOS;
the input of the third NMOS coupled to the output of the first NMOS and the output of the second NMOS, and the output of the third NMOS coupled to ground;
a third resistor coupled to the input of the first NMOS and further coupled to a voltage source, wherein the output of the first NMOS is a low signal of the fourth CML signal;
a fourth resistor coupled to the input of the second NMOS and further coupled to a voltage source, wherein the output of the second NMOS is the high signal of the fourth CML signal;
a fifth resistor comprising an input and an output, wherein the input of the fifth resistor couples to a low output of the fourth CML signal, and the output of the fifth resistor couples to a low signal of the third CML signal; and
a sixth resistor comprising an input and an output, wherein the input of the sixth resistor couples to a high output of the fourth CML signal, and the output of the sixth resistor couples to a high signal of the third CML signal.

13. A system comprising:
a first PMOS comprising a gate, an input, and an output, and configured to receive a high pCML input signal at the gate of the first PMOS;
a second PMOS comprising a gate, an input, and an output, and configured to receive a low pCML signal at the gate of the second PMOS;
a third PMOS comprising a gate, an input, and an output, and configured to receive a bias input signal at the gate of the third PMOS;
the third PMOS further configured to receive an input voltage and to generate an output signal coupled to the input of the first PMOS and the input of the second PMOS;
a first resistor coupled to the output of the first PMOS and further coupled to ground;
wherein the output of the first PMOS is a low signal of the second CML signal;
a second resistor coupled to the output of the second PMOS and further coupled to ground;
wherein the output of the second PMOS is a high signal of the second CML signal;
a first capacitor configured to receive a high input signal of the second CML signal and to generate a high output of the third CML signal;
a second capacitor configured to receive a low input signal of the second CML signal and to generate a low output of the third CML signal;
a first NMOS comprising a gate, an input, and an output, and configured to receive a high input of the third CML signal at the gate of the first NMOS;
a second NMOS comprising a gate, an input, and an output, and configured to receive a low input of the third CML signal at the gate of the second NMOS;
a third NMOS comprising a gate, an input, and an output, and configured to receive a bias input signal at the gate of the third NMOS;
the input of the third NMOS coupled to the output of the first NMOS and the output of the second NMOS, and the output of the third NMOS coupled to ground;
a third resistor coupled to the input of the first NMOS and further coupled to a voltage source, wherein the output of the first NMOS is a low signal of the fourth CML signal;
a fourth resistor coupled to the input of the second NMOS and further coupled to a voltage source, wherein the output of the second NMOS is the high signal of the fourth CML signal;
a fifth resistor comprising an input and an output, wherein the input of the fifth resistor couples to a high output of the fourth CML signal;
a sixth resistor comprising and input and an output, wherein the output of the sixth resistor couples to the output of the fifth resistor, and the input of the sixth resistor couples to a low signal of the fourth CML signal;

a seventh resistor comprising an input and an output, wherein the input of the seventh resistor couples to the output of the fifth resistor and the output of the sixth resistor, and the output of the seventh resistor couples to a high signal of the third CML signal; and an eighth resistor comprising an input and an output, wherein the input of the eighth resistor couples to the output of the fifth resistor and the output of the sixth resistor, and the output of the eighth resistor couples to a low signal of the third CML signal.

14. A system comprising:

a first NMOS comprising a gate, an input, and an output, and configured to receive a high input of an nCML signal at the gate of the first NMOS;

a second NMOS comprising a gate, an input, and an output, and configured to receive a low input of an nCML signal at the gate of the second NMOS;

a third NMOS comprising a gate, an input, and an output, and configured to receive a bias input signal at the gate of the third NMOS;

the input of the third NMOS coupled to the output of the first NMOS and the output of the second NMOS, and the output of the third NMOS coupled to ground;

a first resistor coupled to the input of the first NMOS and further coupled to a voltage source, wherein the output of the first NMOS is a low signal of the second CML signal;

a second resistor coupled to the input of the second NMOS and further coupled to a voltage source, wherein the output of the second NMOS is the high signal of the fourth CML signal;

a first capacitor configured to receive a high input signal of the second CML signal and to generate a high output of the third CML signal;

a second capacitor configured to receive a low input signal of the second CML signal and to generate a low output of the third CML signal;

a first PMOS comprising a gate, an input, and an output, and configured to receive a high signal of the third CML signal at the gate of the first PMOS;

a second PMOS comprising a gate, an input, and an output, and configured to receive a low signal of the third CML signal at the gate of the second PMOS;

a third PMOS comprising a gate, an input, and an output, and configured to receive a bias input signal at the gate of the third PMOS;

the third PMOS further configured to receive an input voltage and to generate an output signal coupled to the input of the first PMOS and the input of the second PMOS;

a third resistor coupled to the output of the first PMOS and further coupled to ground;

wherein the output of the first PMOS is a low signal of the fourth CML signal;

a fourth resistor coupled to the output of the second PMOS and further coupled to ground;

wherein the output of the second PMOS is a high signal of the second CML signal;

a fifth resistor comprising an input and an output, wherein the input of the fifth resistor couples to a low output of the fourth CML signal, and the output of the fifth resistor couples to a low signal of the third CML signal; and a sixth resistor comprising an input and an output, wherein the input of the sixth resistor couples to a high output of the fourth CML signal, and the output of the sixth resistor couples to a high signal of the third CML signal.

15. A system comprising:

a first NMOS comprising a gate, an input, and an output, and configured to receive a high input of an nCML signal at the gate of the first NMOS;

a second NMOS comprising a gate, an input, and an output, and configured to receive a low input of an nCML signal at the gate of the second NMOS;

a third NMOS comprising a gate, an input, and an output, and configured to receive a bias input signal at the gate of the third NMOS;

the input of the third NMOS coupled to the output of the first NMOS and the output of the second NMOS, and the output of the third NMOS coupled to ground;

a first resistor coupled to the input of the first NMOS and further coupled to a voltage source, wherein the output of the first NMOS is a low signal of the second CML signal;

a second resistor coupled to the input of the second NMOS and further coupled to a voltage source, wherein the output of the second NMOS is the high signal of the fourth CML signal;

a first capacitor configured to receive a high input signal of the second CML signal and to generate a high output of the third CML signal;

a second capacitor configured to receive a low input signal of the second CML signal and to generate a low output of the third CML signal;

a first PMOS comprising a gate, an input, and an output, and configured to receive a high signal of the third CML signal at the gate of the first PMOS;

a second PMOS comprising a gate, an input, and an output, and configured to receive a low signal of the third CML signal at the gate of the second PMOS;

a third PMOS comprising a gate, an input, and an output, and configured to receive a bias input signal at the gate of the third PMOS;

the third PMOS further configured to receive an input voltage and to generate an output signal coupled to the input of the first PMOS and the input of the second PMOS;

a third resistor coupled to the output of the first PMOS and further coupled to ground;

wherein the output of the first PMOS is a low signal of the fourth CML signal;

a fourth resistor coupled to the output of the second PMOS and further coupled to ground;

wherein the output of the second PMOS is a high signal of the second CML signal;

a fifth resistor comprising an input and an output, wherein the input of the fifth resistor couples to a high output of the fourth CML signal;

a sixth resistor comprising and input and an output, wherein the output of the sixth resistor couples to the output of the fifth resistor, and the input of the sixth resistor couples to a low signal of the fourth CML signal;

a seventh resistor comprising an input and an output, wherein the input of the seventh resistor couples to the output of the fifth resistor and the output of the sixth resistor, and the output of the seventh resistor couples to a high signal of the third CML signal; and an eighth resistor comprising an input and an output, wherein the input of the eighth resistor couples to the output of the fifth resistor and the output of the sixth resistor, and the output of the eighth resistor couples to a low signal of the third CML signal.

* * * * *